US011901034B2

(12) United States Patent
Guo

(10) Patent No.: US 11,901,034 B2
(45) Date of Patent: Feb. 13, 2024

(54) ASYNCHRONOUS MULTI-PLANE INDEPENDENT SCHEME DYNAMIC ANALOG RESOURCE SHARING IN THREE-DIMENSIONAL MEMORY DEVICES

(71) Applicant: Yangtze Memory Technologies Co., Ltd., Hubei (CN)

(72) Inventor: Jason Guo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 192 days.

(21) Appl. No.: 17/331,226

(22) Filed: May 26, 2021

(65) Prior Publication Data
US 2022/0319571 A1 Oct. 6, 2022

Related U.S. Application Data

(63) Continuation of application No. PCT/CN2021/083909, filed on Mar. 30, 2021.

(51) Int. Cl.
G11C 5/14 (2006.01)
G05F 3/02 (2006.01)
(Continued)

(52) U.S. Cl.
CPC ............... G11C 5/147 (2013.01); G05F 3/02 (2013.01); G11C 16/0483 (2013.01);
(Continued)

(58) Field of Classification Search
CPC ..... G11C 5/147; G11C 16/0483; G11C 16/08; G11C 16/30; G11C 5/145; G11C 8/08;
(Continued)

(56) References Cited

U.S. PATENT DOCUMENTS 6,442,079 B2 8/2002 Lee et al.
9,698,676 B1 * 7/2017 Huynh ............... H02M 3/07
(Continued)

FOREIGN PATENT DOCUMENTS

CN 106843744 A * 6/2017 ........... G06F 3/0614
CN 106843744 A 6/2017
(Continued)

OTHER PUBLICATIONS

International Search Report of the International Searching Authority directed to related International Patent Application No. PCT/CN2021/083909, dated Jan. 5, 2022; 4 pages.
(Continued)

Primary Examiner — Mushfique Siddique
(74) Attorney, Agent, or Firm — Sterne, Kessler, Goldstein & Fox P.L.L.C.

(57) ABSTRACT

A memory device comprising multiple memory planes is disclosed. The memory device further comprises a first pump set coupled with the multiple memory planes, and configured to supply a first output voltage to multiple linear regulators during a steady phase, and a second pump set coupled with the multiple memory planes, and configured to supply a second output voltage to the multiple linear regulators during a ramping phase. The multiple linear regulators can includes a first linear regulator set configured to regulate the first output voltage or the second output voltage to generate a first voltage bias for a first group of word lines of the plurality of memory planes, and a second linear regulator set configured to regulate the first output voltage or the second output voltage to generate a second voltage bias for a second group of word lines of the plurality of memory planes.

20 Claims, 12 Drawing Sheets

(51) Int. Cl.
*G11C 16/04* (2006.01)
*G11C 16/30* (2006.01)
*G11C 16/08* (2006.01)
*G11C 8/08* (2006.01)

(52) U.S. Cl.
CPC .............. *G11C 16/08* (2013.01); *G11C 16/30* (2013.01); *G11C 5/145* (2013.01); *G11C 8/08* (2013.01); *G11C 2211/5631* (2013.01)

(58) Field of Classification Search
CPC ........ G11C 2211/5631; G11C 11/5642; G11C 16/24; G11C 16/26; G05F 3/02
See application file for complete search history.

(56) References Cited

U.S. PATENT DOCUMENTS

| | | | |
|---|---|---|---|
| 10,418,075 B2 | 9/2019 | Mori | |
| 10,553,291 B2 * | 2/2020 | Lee | G11C 29/12015 |
| 10,579,458 B2 * | 3/2020 | Ko | G06F 11/0727 |
| 10,755,750 B2 | 8/2020 | Rowley | |
| 10,796,773 B1 * | 10/2020 | Piccardi | G11C 5/145 |
| 10,867,684 B1 | 12/2020 | Piccardi | |
| 2002/0089370 A1 | 7/2002 | Shin | |
| 2019/0227749 A1 * | 7/2019 | Wakchaure | G06F 3/0604 |
| 2021/0082527 A1 * | 3/2021 | Piccardi | G11C 16/08 |
| 2022/0147480 A1 * | 5/2022 | Guo | G06F 13/4068 |
| 2022/0172788 A1 * | 6/2022 | Piccardi | G11C 29/021 |

FOREIGN PATENT DOCUMENTS

| | | | | |
|---|---|---|---|---|
| CN | 112447206 A | * | 3/2021 | ........ G11C 16/0483 |
| CN | 112447206 A | | 3/2021 | |
| CN | 112513988 A | * | 3/2021 | ........ G06F 12/0246 |
| CN | 112513988 A | | 3/2021 | |
| JP | 2001-229687 A | | 8/2001 | |
| JP | 2010-108541 A | | 5/2010 | |
| TW | I683319 B | | 1/2020 | |
| WO | WO 99/00797 A2 | | 1/1999 | |

OTHER PUBLICATIONS

Notice of Reasons for Refusal directed to Japanese Patent Application No. 2022-578909, dated Oct. 16, 2023; 6 pages.

* cited by examiner

US 11,901,034 B2

ASYNCHRONOUS MULTI-PLANE INDEPENDENT SCHEME DYNAMIC ANALOG RESOURCE SHARING IN THREE-DIMENSIONAL MEMORY DEVICES

CROSS-REFERENCE TO RELATED APPLICATIONS

This application is a continuation application of and claims priority to International Application No. PCT/CN2021/083909 filed on Mar. 30, 2021, which is incorporated herein by reference in its entirety.

TECHNICAL FIELD

The present disclosure generally relates to the field of semiconductor technology, and more particularly, to a method for performing asynchronous multi-plane independent read operations on a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells. In a 3D NAND memory, one chip can comprise multiple dies that can independently perform NAND operations such as read, write, and erase. Each die can comprise multiple memory planes, and each memory plane can comprise multiple memory cells vertically stacked to increase storage capacity per unit area, where memory cells can be addressed from a shared word line.

Asynchronous Multi-Plane Independent (AMPI) read, which means that the multiple memory planes in a die can also perform asynchronous independent read operations, is an important feature on 3D NAND to speed up random read performance. During the asynchronous independent read procedure, a 3D NAND device can have a large capacitive loading when a ramping operation is performed on a plurality of charge pumps to ramp up all unselected word lines. At the beginning of the ramping operation, the outputs of the plurality of charge pumps can be pulled down by charge sharing by multiple memory planes in the 3D NAND device. In order to support AMPI, a conventional scheme is to duplicate the analog resources, such that each plane can have its own driving circuitry, such as pumps and linear regulators and the like, to supply the word line biases.

BRIEF SUMMARY

Embodiments of a three-dimensional (3D) memory device and methods for performing asynchronous multi-plane independent read operations on are described in the present disclosure.

One aspect of the present disclosure provides a memory device, comprising: a plurality of memory planes; a first pump set coupled with the plurality of memory planes, and configured to supply a first output voltage to a plurality of linear regulators during a steady phase; and a second pump set coupled with the plurality of memory planes, and configured to supply a second output voltage to the plurality of linear regulators during a ramping phase; wherein the plurality of linear regulators includes: a first linear regulator set configured to regulate the first output voltage or the second output voltage to generate a first voltage bias for a first group of word lines of the plurality of memory planes, and a second linear regulator set configured to regulate the first output voltage or the second output voltage to generate a second voltage bias for a second group of word lines of the plurality of memory planes.

In some embodiments, each of the plurality of memory planes comprises a plurality of memory strings coupling with a bit line correspondingly; and the first group of word lines have a higher impact to string currents of a read operation of the memory device comparing to the second group of word lines.

In some embodiments, the first group of word lines includes one or more selected word lines, and directly neighbor word lines of the one or more selected word lines.

In some embodiments, the second group of word lines include one or more dummy word lines, or one or more special word lines.

In some embodiments, the first linear regulator set includes a plurality of first linear regulator subsets each corresponding to one of the plurality of memory planes.

In some embodiments, the second linear regulator set comprises: a second linear regulator subset configured to regulate the first output voltage to generate the second voltage bias during the steady phase; and a third linear regulator subset configured to regulate the second output voltage to generate the second voltage bias during the ramping phase.

In some embodiments, the memory device further comprises a multiplexer circuit connected between the first and second pump sets and the first linear regulator set.

In some embodiments, the multiplexer circuit includes a plurality of bidirectional switches each configured to alternatively connect a corresponding first linear regulator subset to the first pump set or the second pump set.

In some embodiments, the memory device further comprises a controller configured to control one of the plurality of bidirectional switches to switch from ramping supply to holding supply after a word line ramping operation is completed.

In some embodiments, the memory device further comprises a detector configured to automatically detect a status of the word line ramping operation.

In some embodiments, the memory device is a three-dimensional NAND memory device.

In some embodiments, the controller is further configured to: control the first pump set to supply the first output voltage to the plurality of linear regulators during a steady phase in an asynchronous multi-plane independent read operation; and control the second pump set to supply the second output voltage to the plurality of linear regulators during a ramping phase in the asynchronous multi-plane independent read operation.

In some embodiments, the controller is further configured to: control the first pump set and/or the second pump set to perform a first ramping operation of a first word line in a first memory plane in response to receive a first read operation; after the first ramping operation of the first word line in the first memory plane is completed, control the first pump set and/or the second pump set to perform a second ramping operation of a second word line in a second memory plane in response to receive a second read operation.

In some embodiments, the controller is further configured to: after the first ramping operation of the first word line in the first memory plane is completed, control the first pump set and/or the second pump set to simultaneously perform a second ramping operation of a second word line in a second memory plane and a third ramping operation of a third word line in a third memory plane in response to receive a second read operation and a third read operation.

In some embodiments, the controller is further configured to: after the second ramping operation of the second word line in the second memory plane is completed, control the first pump set and/or the second pump set to perform a third ramping operation of a third word line in a second memory plane in response to receive a third read operation.

Another aspect of the present disclosure provides a method for performing asynchronous multi-plane independent read operations on a memory device comprising a plurality of memory planes, comprising: controlling a first pump set coupled to the plurality of memory planes to supply a first output voltage to a plurality of linear regulators during a steady phase; controlling a second pump set coupled to the plurality of memory planes to supply a second output voltage to the plurality of linear regulators during a ramping phase; controlling a first linear regulator set in the plurality of linear regulators to regulate the first output voltage or the second output voltage to generate a first voltage bias for a first group of word lines of one of the plurality of memory planes of the memory device; and controlling a second linear regulator set in the plurality of linear regulators to regulate the first output voltage or the second output voltage to generate a second voltage bias for a second group of word lines of one of the plurality of memory planes of the memory device.

In some embodiments, the method further comprising: controlling a second linear regulator subset to regulate the first output voltage to generate the second voltage bias during the steady phase; and controlling a third linear regulator subset to regulate the second output voltage to generate the second voltage bias during the ramping phase.

In some embodiments, the method further comprising controlling a bidirectional switch to alternatively connect a corresponding first linear regulator subset to the first pump set or to the second pump set.

In some embodiments, the method further comprising controlling the bidirectional switch to switch from ramping supply to holding supply after a word line ramping operation is completed.

In some embodiments, the method further comprising: controlling the first pump set to supply the first output voltage to the plurality of linear regulators during a steady phase in an asynchronous multi-plane independent read operation; and controlling the second pump set to supply the second output voltage to the plurality of linear regulators during a ramping phase in the asynchronous multi-plane independent read operation.

In some embodiments, the method further comprising: controlling the first pump set and/or the second pump set to perform a first ramping operation of a first word line in a first memory plane in response to receive a first read operation; after the first ramping operation of the first word line in the first memory plane is completed, controlling the first pump set and/or the second pump set to perform a second ramping operation of a second word line in a second memory plane in response to receive a second read operation.

In some embodiments, the method further comprising: after the first ramping operation of the first word line in the first memory plane is completed, controlling the first pump set and/or the second pump set to simultaneously perform a second ramping operation of a second word line in a second memory plane and a third ramping operation of a third word line in a third memory plane in response to receive a second read operation and a third read operation.

In some embodiments, the method further comprising: after the second ramping operation of the second word line in the second memory plane is completed, controlling the first pump set and/or the second pump set to perform a third ramping operation of a third word line in a second memory plane in response to receive a third read operation.

Another aspect of the present disclosure provides a memory system, comprising: a memory device disclosed above, and a memory controller configured to control the memory device to perform an asynchronous multi-plane independent read operation.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
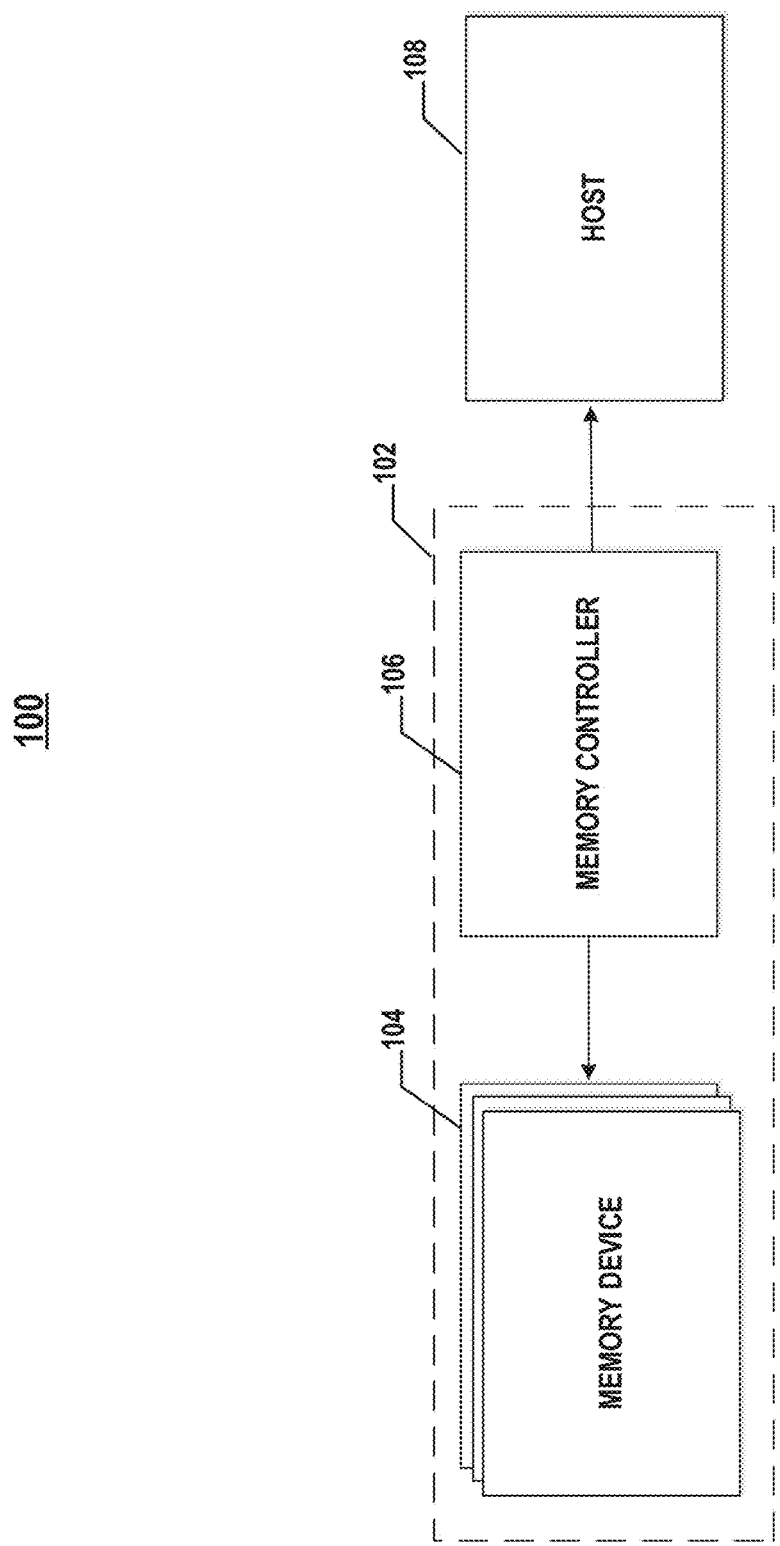
FIG. 1A illustrates a block diagram of an exemplary system having a memory device, in accordance with some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The front surface of the substrate is typically where a semiconductor device is formed, and therefore the semiconductor device is formed at a top side of the substrate unless stated otherwise. The bottom surface is opposite to the front surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1A illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1A, system 100 can include a host 108 and a memory system 102 having one or more memory devices 104 and a memory controller 106.

Host 108 can be a processor of an electronic device, such as a central processing unit (CPU), or a system-on-chip (SoC), such as an application processor (AP). Host 108 can be configured to send or receive the data to or from memory devices 104.

Memory device 104 can be any memory devices disclosed herein, such as a NAND Flash memory device. Consistent with the scope of the present disclosure, memory controller 106 may control the multi-pass programming on memory device 104 such that an NGS operation is enabled on all memory cells, even those passed the respective verify operations, in a non-last programming pass of the multi-pass programming. The peripheral circuits, such as the word line drivers, may apply a low voltage, e.g., ground (GND) voltage, on the DSGs of each memory string coupled to the selected word line, and may apply a low or negative voltage on the selected word line to enable an NGS operation on all memory cells coupled to the selected word line during a non-last programming pass.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, programming memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 1C:
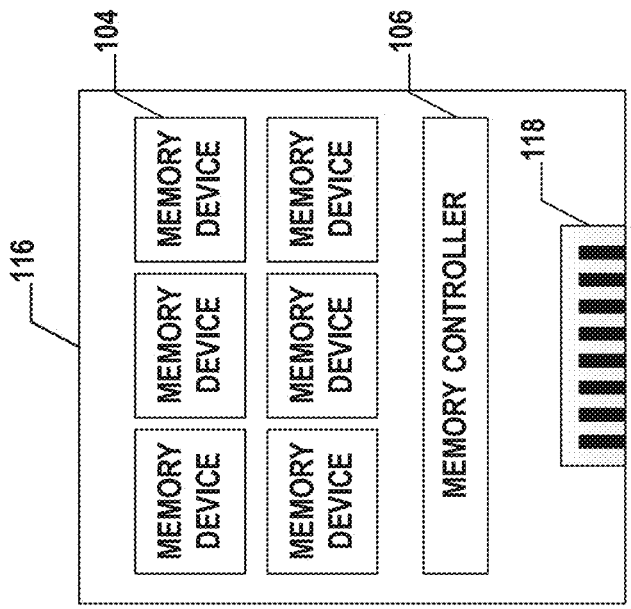
FIG. 1C illustrates a diagram of an exemplary solid-state drive (SSD) having a memory in accordance with some embodiments.
Figure 1B:
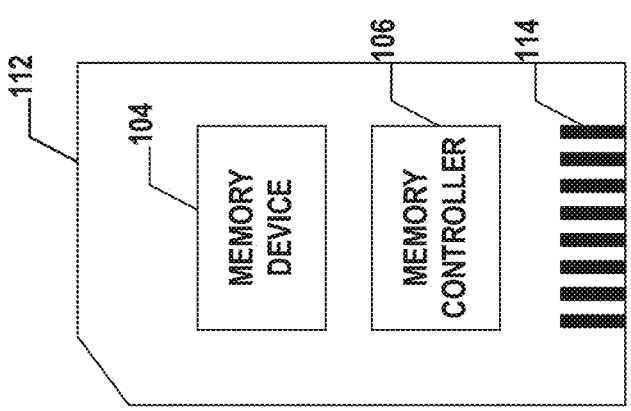
FIG. 1B illustrates a diagram of an exemplary memory card having a memory device, in accordance with some embodiments.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 1B, memory controller 106 and a single memory device 104 may be integrated into a memory card 112. Memory card 112 can include a PC card (PCMCIA, personal computer memory card international association), a CF card, a smart media (SM) card, a memory stick, a multimedia card (MMC, RS-MMC, MMCmicro), an SD card (SD, miniSD, micro SD, SDHC), a UFS, etc. Memory card 112 can further include a memory card connector 114 coupling memory card 112 with a host (e.g., host 108 in FIG. 1A). In another example as shown in FIG. 1C, memory controller 106 and multiple memory devices 104 may be integrated into an SSD 116. SSD 116 can further include an SSD connector 118 coupling SSD 116 with a host (e.g., host 108 in FIG. 1A). In some implementations, the storage capacity and/or the operation speed of SSD 116 is greater than those of memory card 112.

Figure 2:
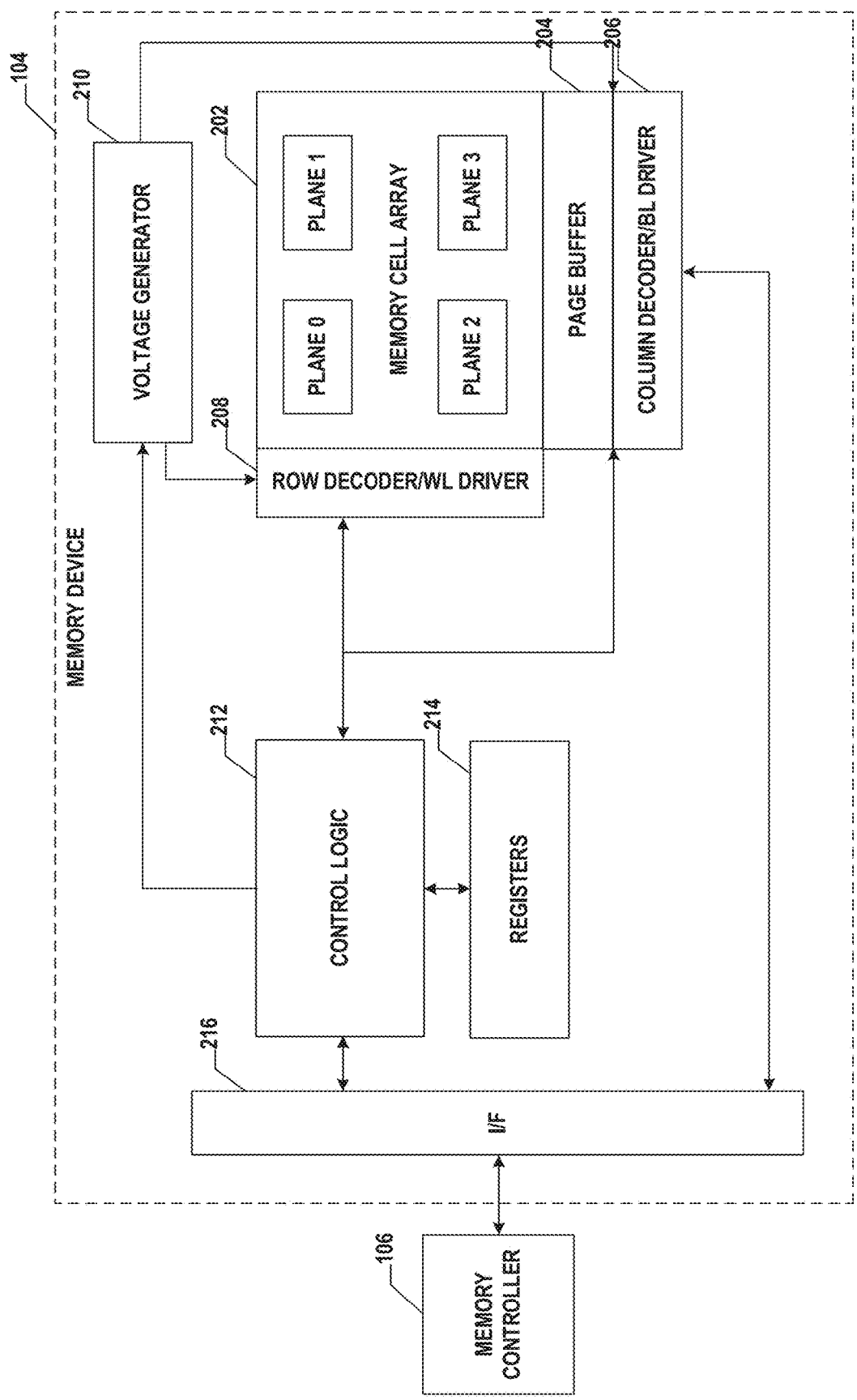
FIG. 2 illustrates a schematic block diagram of an example hardware module configuration of a memory system, in accordance with some embodiments.
Figure 3:
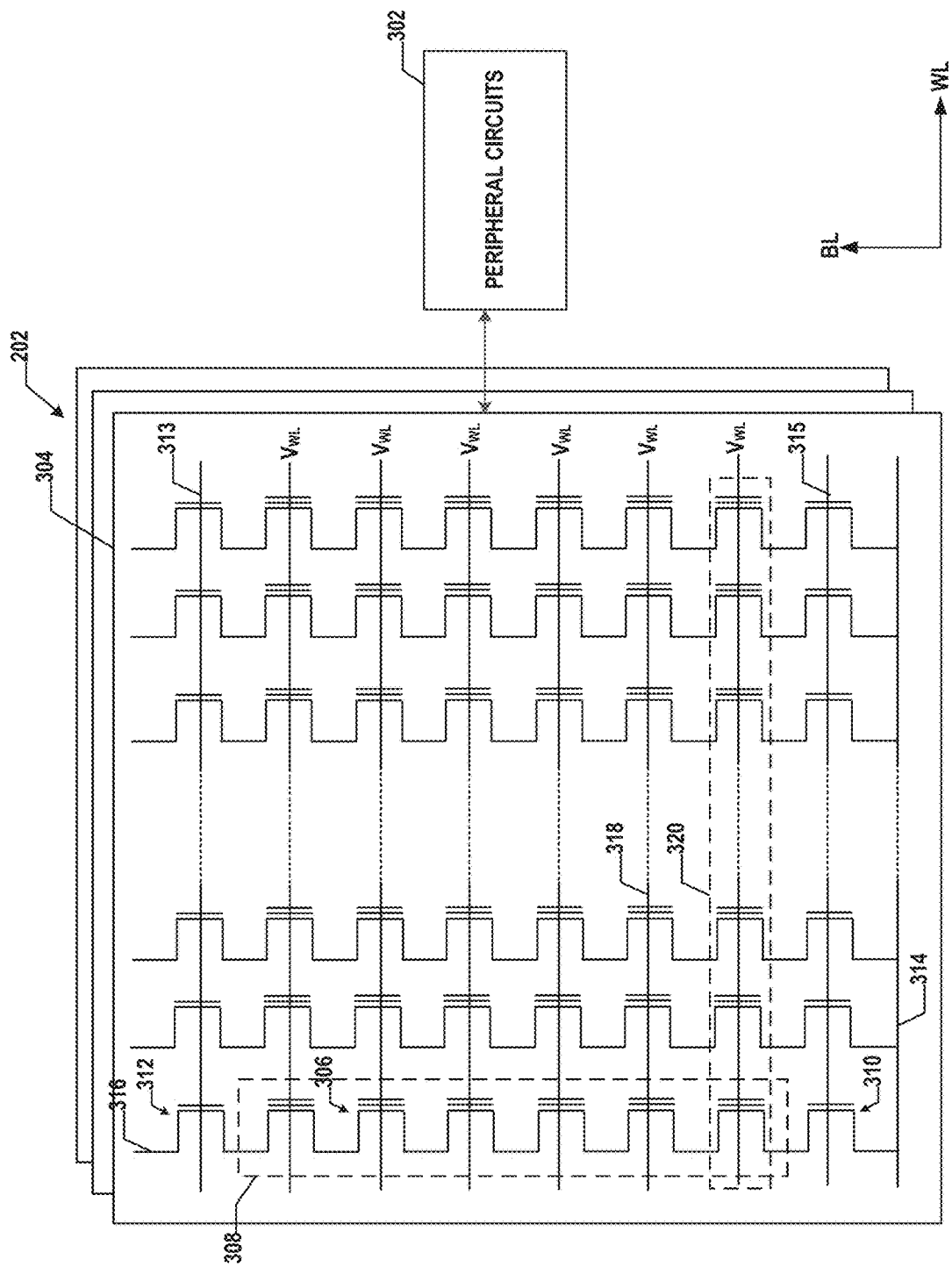
FIG. 3 illustrates a schematic circuit diagram of an exemplary memory device including peripheral circuits, according to some aspects of the present disclosure.

FIG. 2 illustrates a diagram of an exemplary memory device 104, e.g., a NAND Flash memory, having a memory cell array 202 and peripheral circuits including a page buffer 204, a column decoder/bit line driver 206, a row decoder/word line driver 208, a voltage generator 210, control logic 212, registers 214, and an interface 216. FIG. 3 illustrates a schematic circuit diagram of an exemplary memory device 104 including a memory cell array 202 and peripheral circuits 302 coupled to memory cell array 202. For ease of illustration, some components in FIGS. 2 and 3 are described together. Peripheral circuits 302 can include page buffer 204, column decoder/bit line driver 206, row decoder/word line driver 208, voltage generator 210, control logic 212, registers 214, and interface 216 in FIG. 2. It is understood that in some examples, additional peripheral circuits may be included as well.

In some embodiments, the voltage generator 210 can include a plurality of charge pumps and linear regulators. In some embodiments, the memory cell array can include multiple planes (i.e., plane 0, plane 1, plane 2, and plane 3). Although FIG. 2 shows four planes (plane 0, plane 1, plane 2, and plane 3), in some other embodiments, a NAND die may be divided into fewer or more than four planes (e.g., 1, 2, 6, 8, etc.). A plane includes multiple memory cells which may be grouped into memory blocks. A memory block is typically the smallest erasable entity in a NAND flash die. In one example, a memory block includes a number of cells that are coupled to the same bit line. A memory block includes one or multiple pages of cells. The size of the page can vary depending on implementation. In one example, a page has a size of 16 kB. Page sizes of less or more than 16 kB are also possible (e.g., 512 B, 2 kB, 4 kB, etc.).

It is noted that, NAND memory devices are capable of performing a read operation on one plane at a time. Such NAND memory devices have a single state machine for the whole die. If a read is being serviced on one plane, the other planes are idle. Therefore, such reads (called single plane reads) do not utilize all the planes at the same time. The lack of concurrency leads to high latency due to, for example, reads getting "stuck" behind other reads.

Another type of operation is a multi-plane operation (e.g., a quad plane read that performs a read on four planes at once). With multi-plane operations, there are multiple restrictions on the commands. For array commands, the array operation has to be the same (e.g., program, erase, or, read, but not a combination) and also the page type for those array operations has to be same. The voltage biasing to access different page types (e.g., lower page, upper page, etc.) is different, and the single state machine on the die applies the same voltage bias for all the planes. With random workloads, this requirement is hard to meet for read commands. The likelihood of receiving reads for the same page type on all four planes is low for a random workload. Therefore, the improvement in read latency with a quad plane read is minimal for a random workload. Accordingly, this feature is not typically utilized for random read workloads, which is typically considered to be a key workload for SSDs (solid state drives).

Another solution attempted was to combine reads of different page types on different planes into a single command. However, all those reads are handled as a single command by the NAND, which means there is single start and completion for the reads. Therefore, with such a technique the read duration is dominated by the worst (e.g., slowest) page type and asynchronous reads are not possible. Accordingly, combining different page types on different planes into a single command also results in minimal increases in performance and Quality of Service (QoS).

In contrast to conventional NAND operations, independent multi-plane operations enable independent and concurrent operations per plane. Separate state machines for each plane enable application of different bias voltages for each plane to independently and concurrently service requests. All NAND array commands are allowed independently on the plane level, enabling significant performance improvements. An array command is a command that causes an array operation, such as programming data to the array, reading data from the array, erasing a block, or other operations on the array.

In one example, each plane can receive and service a different array command (e.g., read command, program command, erase command, etc.), and the commands can be sent and completed at different times. Non-array commands (e.g., reset command, timing mode change command, etc.) can be maintained as die-level commands. In an alternative example, read operations are allowed independently on the plane level. Other operations, such as program command and erase command, are die-level operations. Further, some supporting commands for read, such as read status and read column enhanced may also be plane-level commands.

As shown in FIG. 3, memory cell array 202 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor. In one example, the memory cell 306 includes a transistor with a replacement gate. A memory cell 306 with a replacement gate typically has a low resistance gate (e.g., a tungsten gate) and a charge trap layer between the gate and the channel where charge is trapped or stored to represent one or more bit values. In another example, a memory cell 306 can include a transistor with a floating gate (e.g., a high resistance poly gate) that stores charge indicative of one or more bit values. Other architectures are also possible.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages, in some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can include a source select gate (SSG) 310 at its source end and a drain select gate (DSG) 312 at its drain end. SSG 310 and DSG 312 are respective the gate electrodes of an SSG transistor and a DSG transistor and can be configured to activate selected NAND memory strings 308 (columns of the array) during read and program operations. In some implementations, SSGs 310 of NAND memory strings 308 in the same block 304 are coupled through a same source line (SL) 314, e.g., a common SL, for example, to the ground. DSG 312 of each NAND memory string 308 is coupled to a respective bit line 316 from which data can be read via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 3, NAND memory strings 308 can be organized into multiple blocks 304, each of which can have a common source line 314. In some implementations, each block 304 is the basic data unit for erase operations, i.e., all memory cells 306 on the same block 304 are erased at the same time. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can correspond to the number of NAND memory strings 308 coupled by word line 318 in one block 304. Each word line 318 can include a plurality of control gates (gate electrodes) at each memory cell 306 in respective page 320 and a gate line coupling the control gates. In some cases, dummy word lines, which contain no user data, can also be used in the memory array adjacent to the select gate transistors. Such dummy word lines can shield the edge data word line from certain edge effects.

Peripheral circuits 302 can be coupled to memory cell array 202 through bit lines 316, word lines 318, source lines 314, SSG lines 315, and DSG lines 313. Peripheral circuits 302 may apply voltages on bit lines 316, word lines 318, source lines 314, SSG lines 315, and DSG lines 313 to perform multi-pass programming including the proposed NGS scheme in a non-last programming pass. As described above, peripheral circuits 302 can include any suitable circuits for facilitating the operations of memory cell array 202 by applying and sensing voltage signals and/or current signals through bit lines 316 to and from each target memory cell 306 through word lines 318, source lines 314, SSG lines 315, and DSG lines 313. Peripheral circuits 302 can include various types of peripheral circuits formed using MOS technologies.

A programming sequence for a group of memory cells 306 can include programming of all of the intended pages into the group of memory cells 306. A programming sequence can include one or more programming passes. A programming pass (which can include one or more programming loops) can program one or more pages. A programming pass can include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage to a cell can include changing the voltage difference between a control gate and a channel of the cell in order to change the threshold voltage of the cell. Accordingly, a voltage of a word line (coupled to the control gate of the target cell) and/or a channel of the cell can be set in order to effectuate application of an effective program voltage. As a program voltage is commonly used to refer to a voltage applied to a word line, the effective program voltage can be the voltage difference between a control gate and channel of a cell (which in instances where the channel is held at 0V can be synonymous with a program voltage).

Figure 4A:
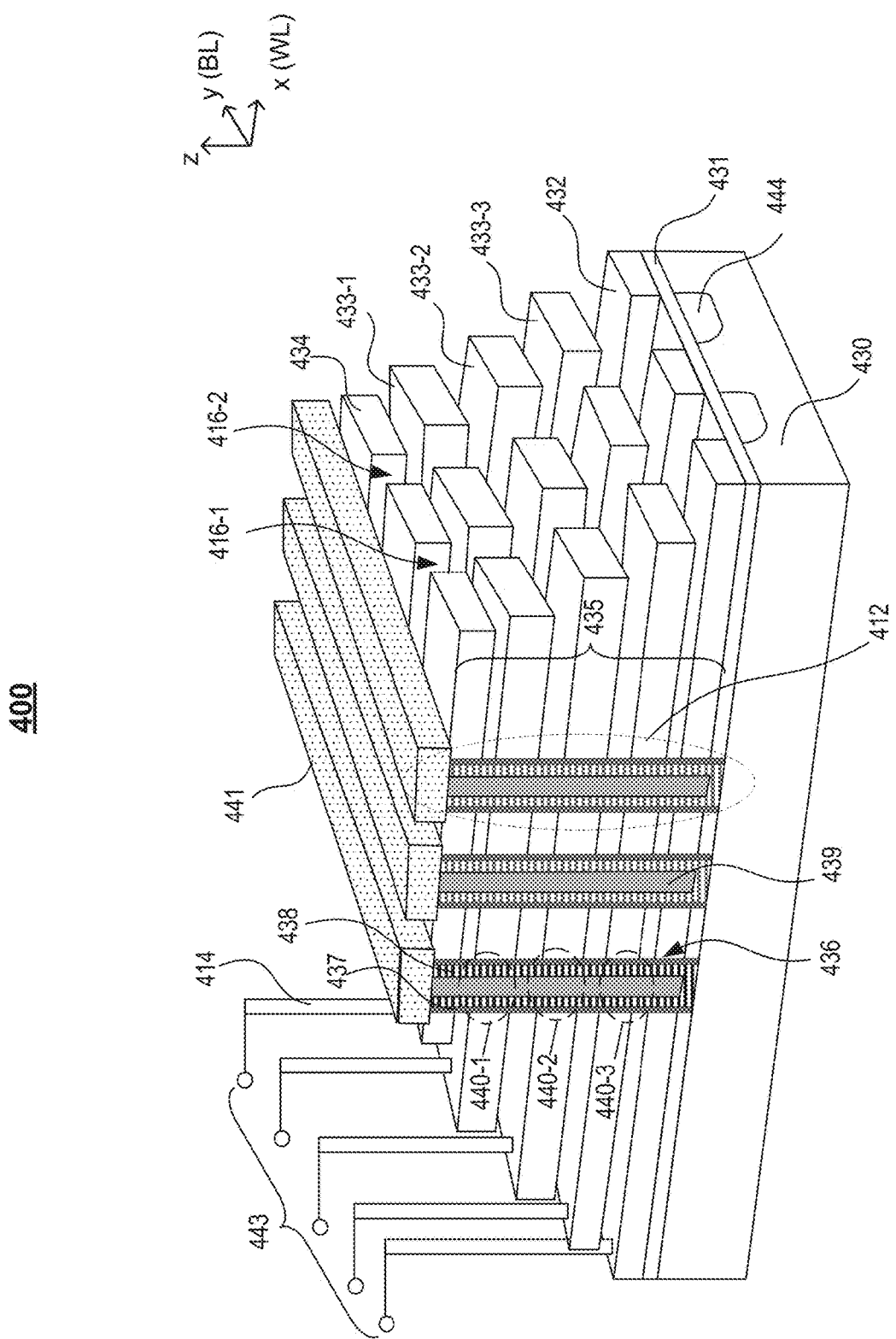
FIG. 4A illustrates a perspective view of a portion of an exemplary three-dimensional (3D) memory array structure, in accordance with some embodiments.

FIG. 4A illustrates a perspective view of a portion of an exemplary three-dimensional (3D) memory cell array structure 400, according to some embodiments. The memory cell array structure 400 includes a substrate 430, an insulating film 431 over the substrate 430, a tier of bottom select gates (BSGs) 432 over the insulating film 431, and a plurality of tiers of control gates 433, also referred to as "word lines" (WLs) stacking on top of the BSGs 432 to form a film stack 435 of alternating conductive and dielectric layers. The dielectric layers adjacent to the tiers of control gates are not shown in FIG. 4 for clarity.

The control gates of each tier are separated by slit structures 416-1 and 416-2 through the film stack 435. The memory cell array structure 400 also includes a tier of top select gates (TSGs) 434 over the stack of control gates 433. The stack of TSGs 434, control gates 4133 and BSGs 432 is also referred to as "gate electrodes." The memory cell array structure 400 further includes memory strings 412 and doped source line regions 444 in portions of substrate 430 between adjacent BSGs 432. Each memory strings 412 includes a channel hole 436 extending through the insulating film 431 and the film stack 435 of alternating conductive and dielectric layers. Memory strings 412 also includes a memory film 437 on a sidewall of the channel hole 436, a channel layer 438 over the memory film 437, and a core filling film 439 surrounded by the channel layer 438. A memory cell 440 can be formed at the intersection of the control gate 433 and the memory string 412. A portion of the channel layer 438 underneath the control gate 433 is also referred to as the channel of the memory cell 440. The memory cell array structure 400 further includes a plurality of bit lines (BLs) 441 connected with the memory strings 412 over the TSGs 434. The memory cell array structure 400 also includes a plurality of metal interconnect lines 443 connected with the gate electrodes through a plurality of contact structures 414. The edge of the film stack 435 is configured in a shape of staircase to allow an electrical connection to each tier of the gate electrodes.

In FIG. 4A, for illustrative purposes, three tiers of control gates 433-1, 433-2, and 433-3 are shown together with one tier of TSG 434 and one tier of BSG 432. In this example, each memory string 412 can include three memory cells 440-1, 440-2 and 440-3, corresponding to the control gates 433-1, 433-2 and 433-3, respectively. The number of control gates and the number of memory cells can be more than three to increase storage capacity. The memory cell array structure 400 can also include other structures, for example, TSG cut structures, common source contacts and dummy memory strings, etc. These structures are not shown in FIG. 4A for simplicity.

Figure 4B:
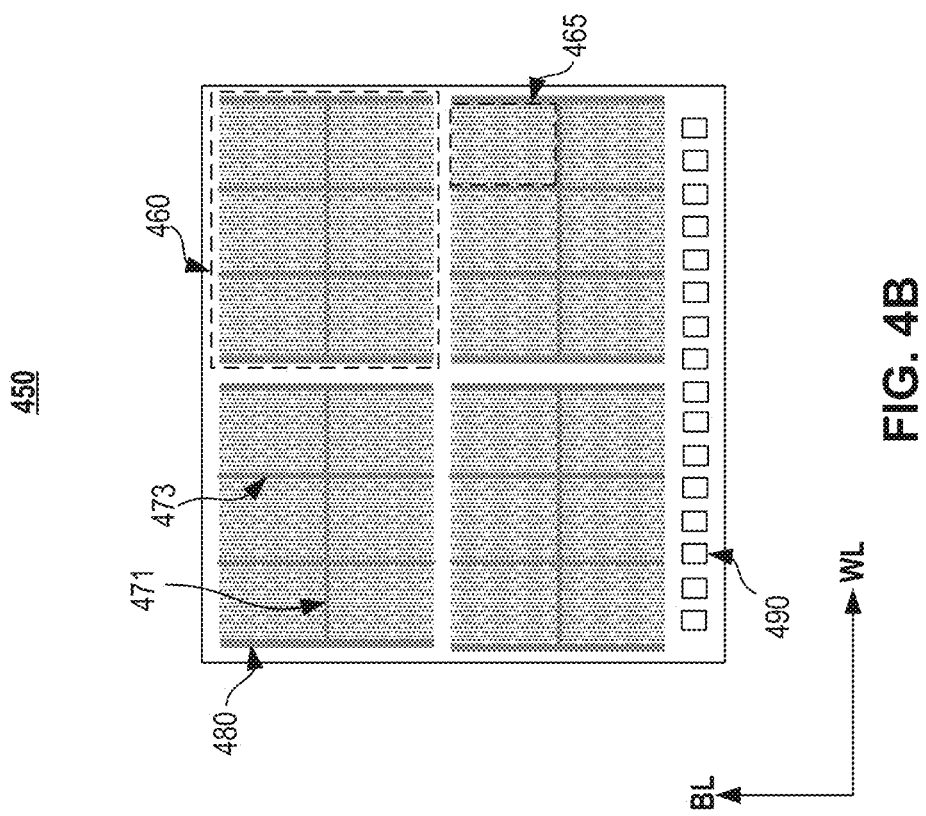
FIG. 4B illustrates a schematic diagram of an exemplary 3D memory device in a plan view, in accordance with some embodiments.

FIG. 4B illustrates a schematic diagram of an exemplary 3D memory device 450 in the plan view, according to some embodiments of the present disclosure. 3D memory device 450 can include a plurality of channel structure regions, such as memory planes, memory blocks, memory fingers, etc., and one or more through array contact (TAC) structures can be formed between two neighboring channel structure regions. In some embodiments as shown in FIG. 4B, 3D memory device 450 can include four or more memory planes 460, each of which can include a plurality of memory blocks 465. It is noted that, the arrangement of memory planes 460 in 3D memory device 450 and the arrangement of memory blocks 465 in each memory plane 460 illustrated in FIG. 4B are only used as an example, which is not limit the scope of the present disclosure.

TAC structures can include one or more bit line (BL) TAC regions 471 that are sandwiched by two neighboring memory blocks 465 in the bit line direction of the 3D memory device (labeled as "BL" in figures) and extended along the word line direction of the 3D memory device (labeled as "WL" in figures), one or more word line (BL) TAC regions 473 that are sandwiched by two neighboring memory blocks 465 in the word line direction (WL) and extended along the bit line direction (BL), and one or more staircase structure (SS) TAC regions 480 that are located at the edges of each memory plane 460.

In some embodiments, 3D memory device 450 can include a plurality of contact pads 490 arranged in a line at an edge of the 3D memory device 450. Interconnect contact can be used for electrically interconnect 3D memory device 450 to any suitable device and/or interface that provide driving power, receive control signal, transmit response signal, etc.

Figure 5:
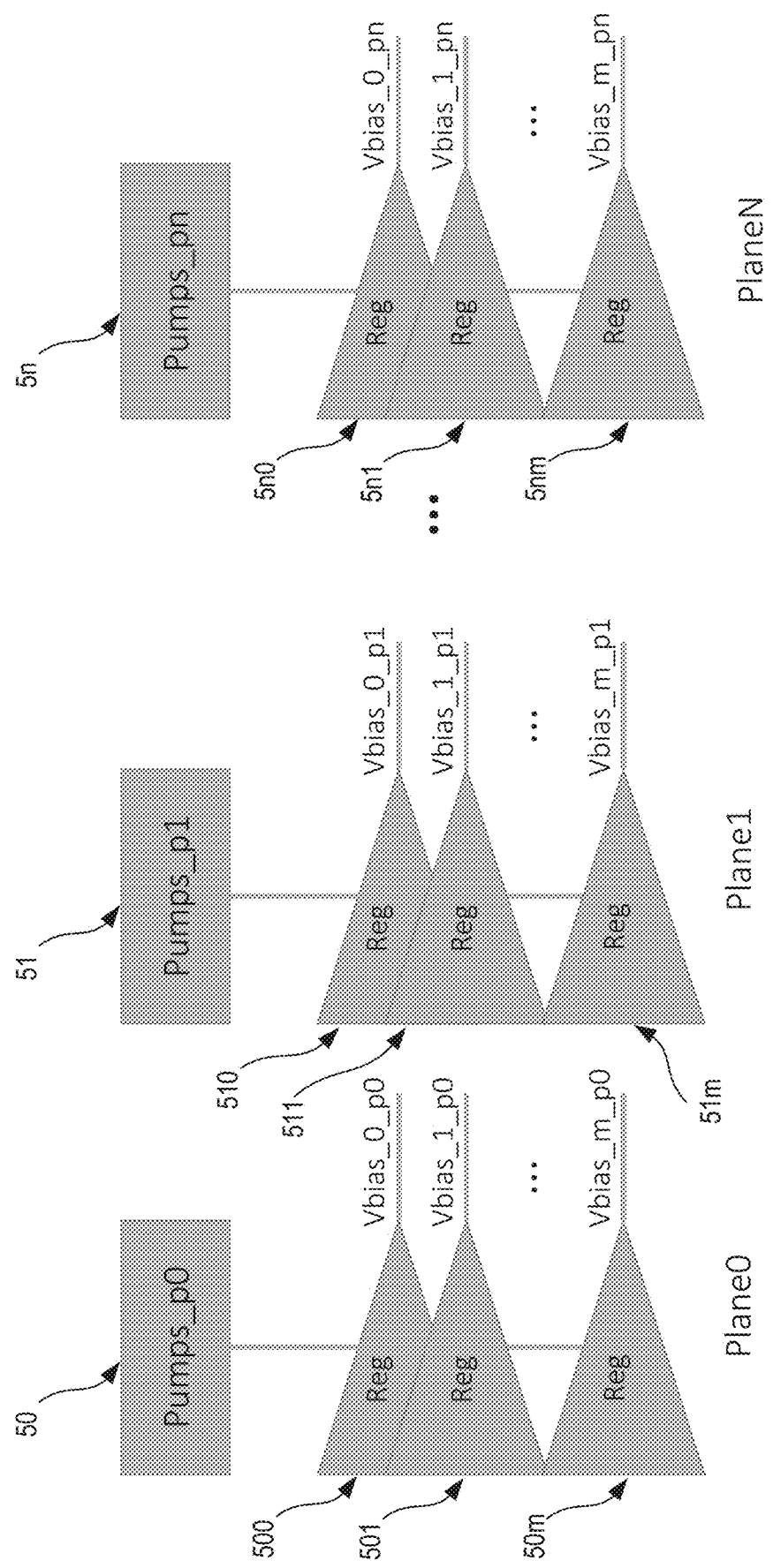
FIG. 5 illustrates a schematic logic circuit diagram of an example driving system of word lines of a 3D NAND device, in accordance with some embodiments.

FIG. 5 illustrates a schematic logic circuit diagram of an example driving system of word lines of a 3D NAND device, according to some existing systems.

As described above in the background section, Asynchronous Multi Plane Independent (AMPI) read allows the multiple planes being able to perform asynchronous independent read operations, thus significantly speed up the random read performance of the 3D NAND. In order to support AMPI read, a conventional scheme is to design the driving system to duplicate the analog resources, such that each plane can have its own driving circuitry, such as pumps and linear regulators and the like, to supply the word line biases. It is noted that, the pumps are also referred to pre-charge drivers, can be used to pre-charge the planes prior to read operations. The linear regulators can be direct current (DC) linear voltage regulators (e.g., low-dropout regulators) that can regulate the output voltage of the pumps.

As shown in FIG. 5, Plane0 can be connected to pumps 50 and multiple linear regulators 500, 501, . . . 50$m$; Plane1 can be connected to pumps 51 and multiple linear regulators 510, 511, . . . 51$m$; . . . ; PlaneN can be connected to pumps 5$n$ and multiple linear regulators 5$n$0, 5$n$1, N is the number of planes and m is the number of word lines in each plane. That is, in the conventional scheme, each driving circuitry is connected to a respective one of the multiple plane with no intervening connection. In such scheme, if a chip has 4 or more planes, the cost of area and power for such arrangement can be relatively high.

Figure 6:
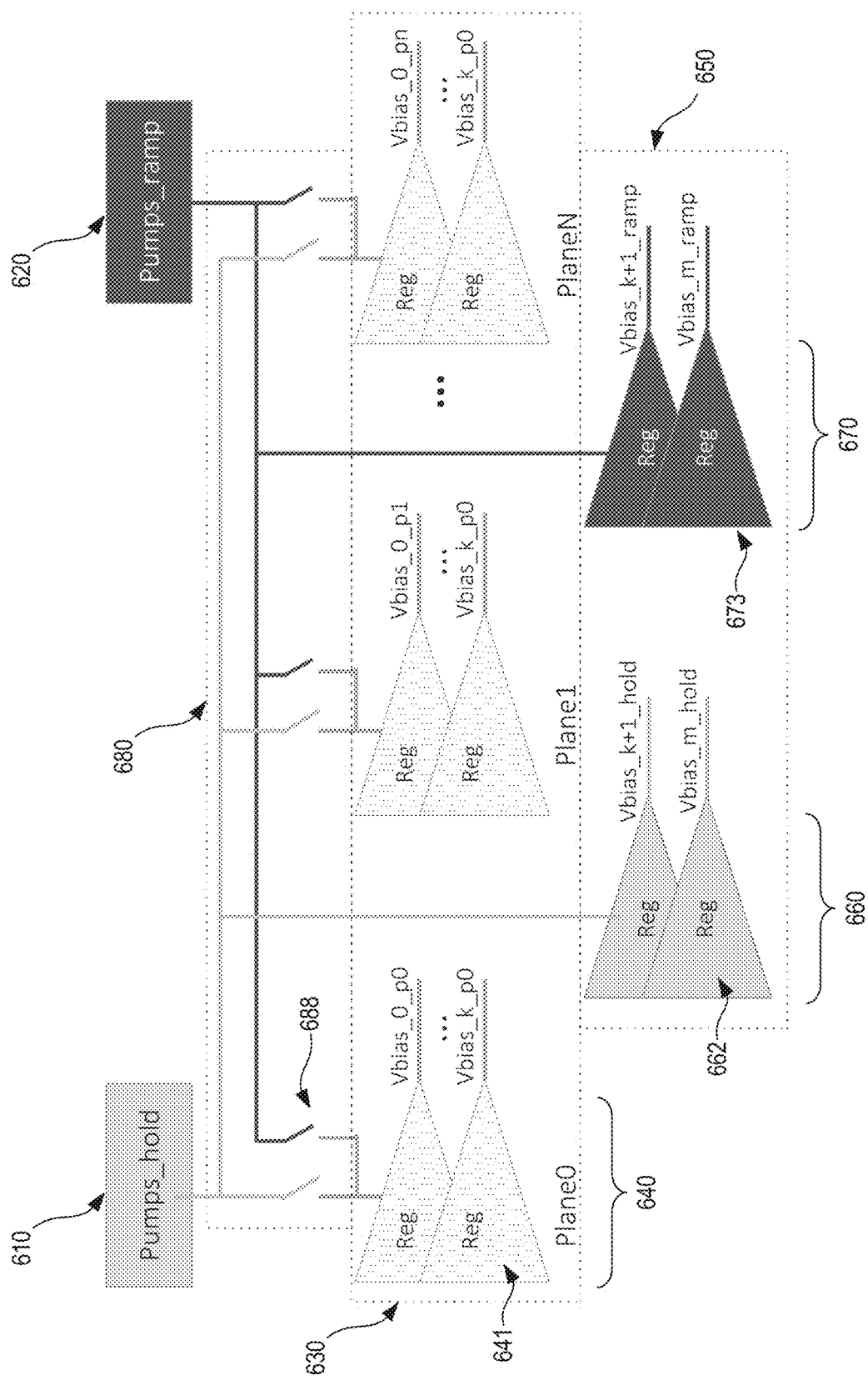
FIG. 6 illustrates a schematic logic circuit diagram of another example driving system of word lines of a 3D NAND device, in accordance with some embodiments.

FIG. 6 illustrates a schematic logic circuit diagram of another example driving system of word lines of a 3D NAND device, according to some embodiments.

As shown, multiple pumps can be separated into 2 groups: a first pump set 610 and a second pump set 620. The first pump set 610 can be used to supply a first output voltage to the linear regulators during a steady phase (pumps_hold state). The second pump set 620 can be used to supply a second output voltage to the linear regulators during a ramping phase (pumps_ramp state).

The linear regulators can also be separated into two groups: a first linear regulator set 630 and a second linear regulator set 650. The first linear regulator set 630 can be used for regulating the first output voltage or the second output voltage to supply a first word line voltage bias for a first group of word lines. In some embodiments, the first group of word lines can have a high significance to the performance of the NAND device. For example, the first group of word lines can have a higher impact to string currents of a read operation of the memory device comparing to the second group of word lines. The second linear regulator set 650 can be used for regulating the first output voltage or the second output voltage to supply a word line voltage bias for a second group of word lines. In some embodiments, the second group of word lines can have a lower significance to the performance of the NAND device comparing to the first group of word lines. For example, the second group of word lines can have a lower impact to string currents of a read operation of the memory device comparing to the first group of word lines.

In some embodiments, the first linear regulator set 630 can include a number N of first linear regulator subsets 640 each for a corresponding one of a number N of planes (e.g., Plane0, Plane1, . . . PlaneN). Each first linear regulator subset 640 can include a number k of first linear regulators 641. In some embodiments, each first linear regulator 641 can be used to drive one or more selected word lines that can have a high significance to the performance of the NAND device. For example, each first linear regulator 641 can be used to drive a selected word lines (e.g., WLn) and its directly neighbor word lines (e.g., WLn+1 and WLn−1). In some embodiments, each first linear regulator 641 can be used to drive a first number of word lines, wherein the first number is larger than or equal to a predetermined number.

In some embodiments, the second linear regulator set 650 can include a second linear regulator subset 660 and a third linear regulator subset 670. Each second linear regulator 662 in the second linear regulator subset 660 can be used to regulate the first output voltage to generate a second word line voltage bias during the steady phase (pumps_hold state). Each third linear regulator 673 in the third linear regulator subset 670 can be used to regulate the second output voltage to generate a third word line voltage bias during the ramping phase (pumps_ramp state). The second linear regulators 662 and the third linear regulators 673 can be used to drive one or more word lines that can have a less significance to the performance of the NAND device. For example, each second linear regulator 662 or third linear regulator 673 can be used to drive one or more dummy word lines or drive one or more special word lines. In some embodiments, each second linear regulator 662 or third linear regulator 673 can be used to drive a second number of word lines, wherein the second number is smaller than the predetermined number.

Comparing to the configuration of duplicating the pumps and linear regulators by number of planes as shown in FIG. 5, the configuration as shown in FIG. 6 includes two sets of pumps and linear regulators shared across all planes. Each first linear regulator subset 640 can include a number k of first linear regulators 641. The second linear regulator subset 660 can include a number (m−k) of second linear regulators 662, and the third linear regulator subset 670 can include a number (m−k) of third linear regulators 673. As such, the total number of linear regulators can be significantly reduced from n×m to (n×k+2m−2k).

As shown in FIG. 6, the ramping regulator output and the steady regulator output can be connected to a multiplexer circuit 680 to interconnect to all planes (e.g., Plane0, Plane1, . . . , PlaneN). Each first linear regulator subset can be alternatively connected to the first pump set 610 and the second pump set 620 through a bidirectional switch 688. In some embodiments, a controller (e.g., controller 404 as shown in FIG. 4) can initiate the switching from ramping supply to holding supply right after the ramping is completed. One possible simple implementation can use a trimmable delay for such switching. Another improved implementation can be achieved by an auto detection scheme of ramping completion.

It is noted that, most of the NAND x-path biases ramp up at the beginning of the read operation and stay at the same voltage level until the recovery. Some biases can have a pulse at the beginning of the read operation. The disclosed asynchronous multi-plane independent (AMPI) dynamic analog resource sharing scheme as shown in FIG. 6 can meet such requirements, and can have area and power advantages over the scheme as shown in FIG. 5.

In one example, the number n of planes is 4. To support a 4-way AMPI, only two groups of pumps instead of 4 groups are can be used in the disclosed AMPI dynamic analog resource sharing scheme. As described above, the total number of linear regulators is reduced from 4m to (2k+2m). Therefore, the disclosed AMPI dynamic analog resource sharing scheme can have both area and power benefits by having less numbers of pumps and linear regulators. In some embodiments, the tradeoff is that there is extra latency sometimes, depending on the time separations of AMPI read command entries.

Figure 7A:
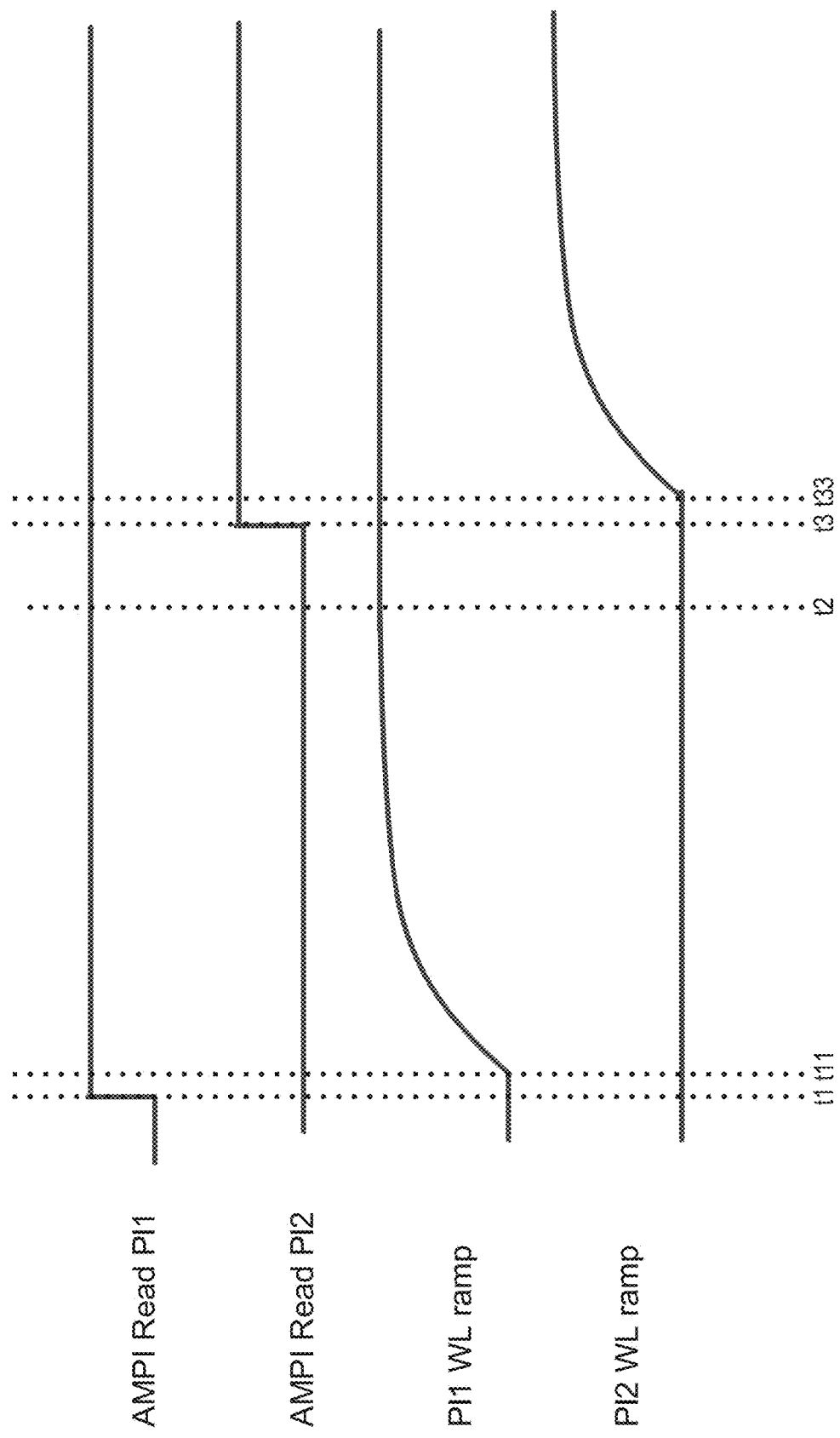
FIGS. 7A-7D illustrate schematic voltage time evolution diagrams of an example driving system of word lines of a 3D NAND device under various implementations of memory operations, in accordance with some embodiments.

As shown in FIG. 7A, a first AMPI command for a first plane (e.g., AMPI Read PI1 command as labeled) is entered at time point t1, and the ramping resources including pumps and linear regulators for the first plane can start ramp at time point t11. After the ramping operation of the first plane is completed at time point t2, a second AMPI command for a second plane (e.g., AMPI Read PI2 command as labeled) is entered at time point t3, and the ramping resources including pumps and linear regulators for the second plane can start ramp at time point t33. Generally, word line ramping time occupies a relatively small percentage of read time. As shown in FIG. 7A, the latency time periods (t11-t1) and (t33-t3) are small and negligible, thus can be considered as zero latency.

Figure 7B:
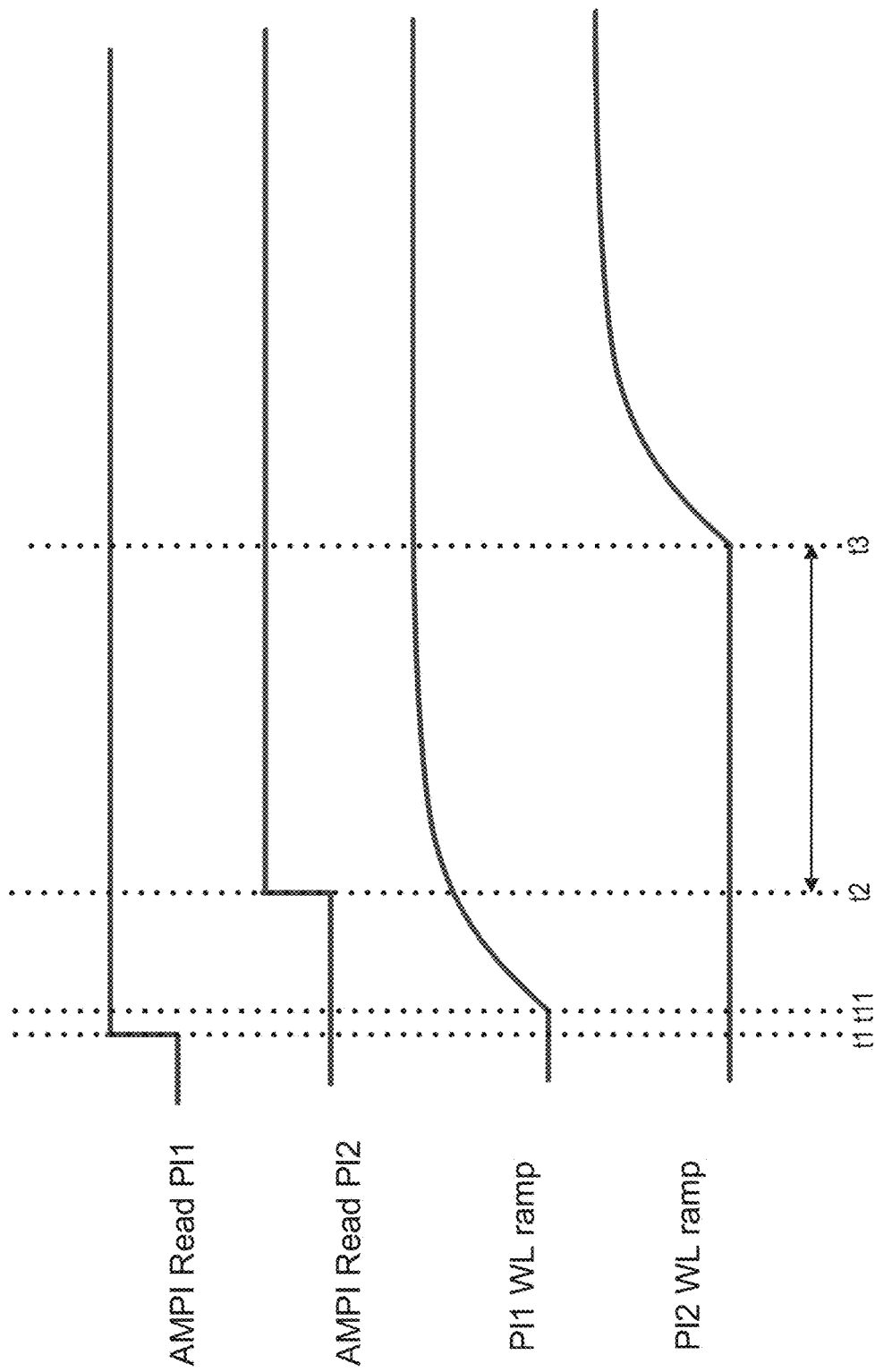

As shown in FIG. 7B, a first AMPI command for a first plane (e.g., AMPI Read PI1 command as shown) is entered at time point t1, and the ramping resources including pumps and linear regulators for the first plane can start ramp at time point t11. A second AMPI command for a second plane (e.g., AMPI read PI2 as labeled) is entered at time point t2, while the first plane is in the middle of word line ramping. Since the ramping resources including pumps and linear regulators are busy, there is an extra latency to wait till the first plane completes the ramping at time point t3. As shown in FIG. 7B, the extra latency time period for the second AMPI command is (t3-t2).

Figure 7C:
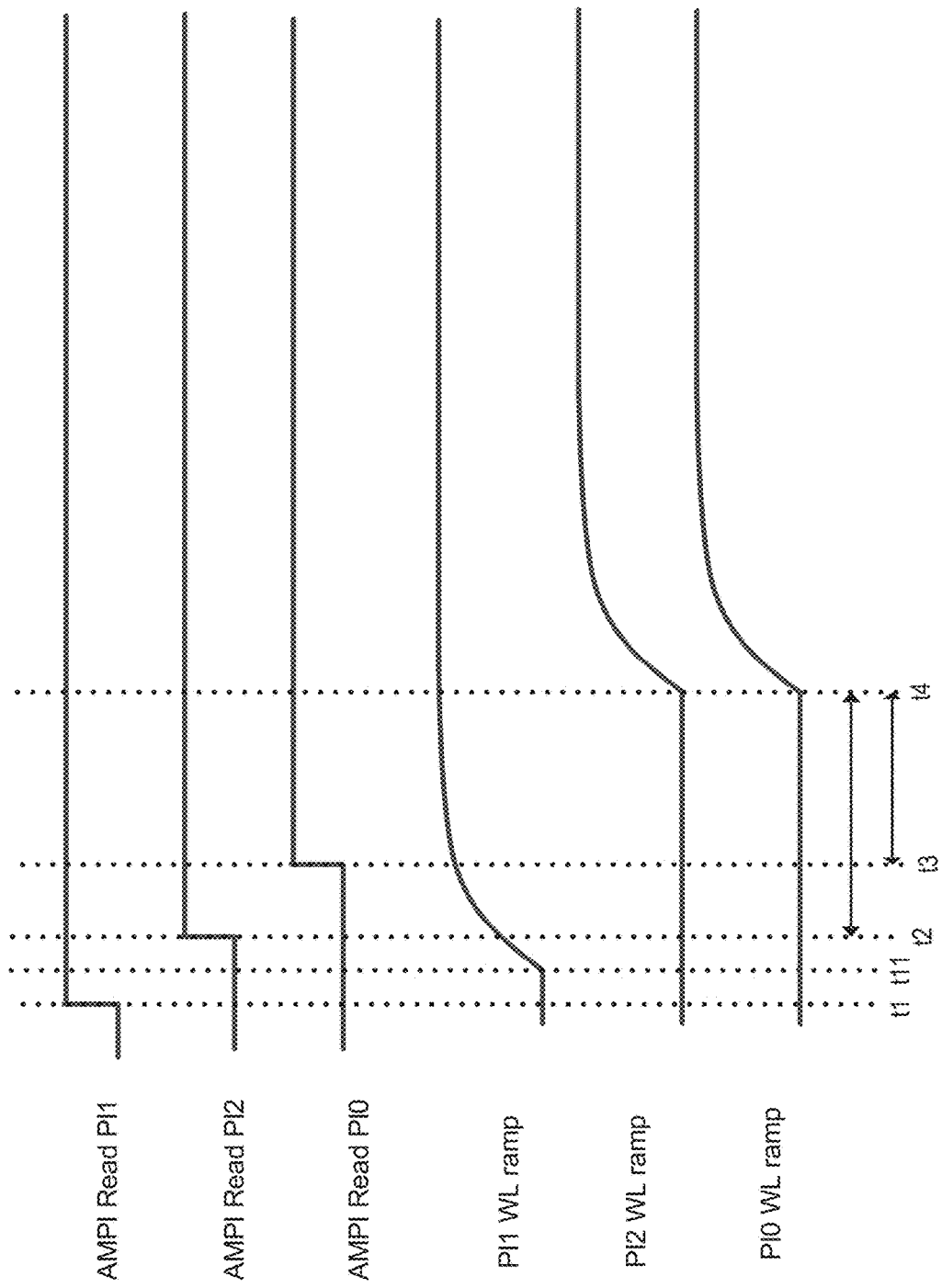

In one implementation, if multiple AMPI commands are entered while one plane is in the middle of word line ramping, one possible implementation is that the controller can ramp word lines one plane at a time. For example, an auto detection of ramp completion of one plane can trigger a ramping operation of a next plane. Such implementation is straightforward, but one or more planes can have a longer latency. As shown in FIG. 7C, a first AMPI command for a first plane (e.g., AMPI Read PI1 command as shown) is entered at time point t1, and the ramping resources including pumps and linear regulators for the first plane can start ramp at time point t11. A second AMPI command for a second plane (e.g., AMPI read PI2 as labeled) is entered at time point t2, and a third AMPI command for a third plane (e.g., AMPI read PI0 as labeled) is entered at time point t3, while the first plane is in the middle of word line ramping. There is an extra latency time period (t4-t2) for the second AMPI command to wait till the first plane completes the ramping at time point t4, and there is an extra latency time period (t5-t3) for the third AMPI command to wait till the second plane completes the ramping at time point t5.

Figure 7D:
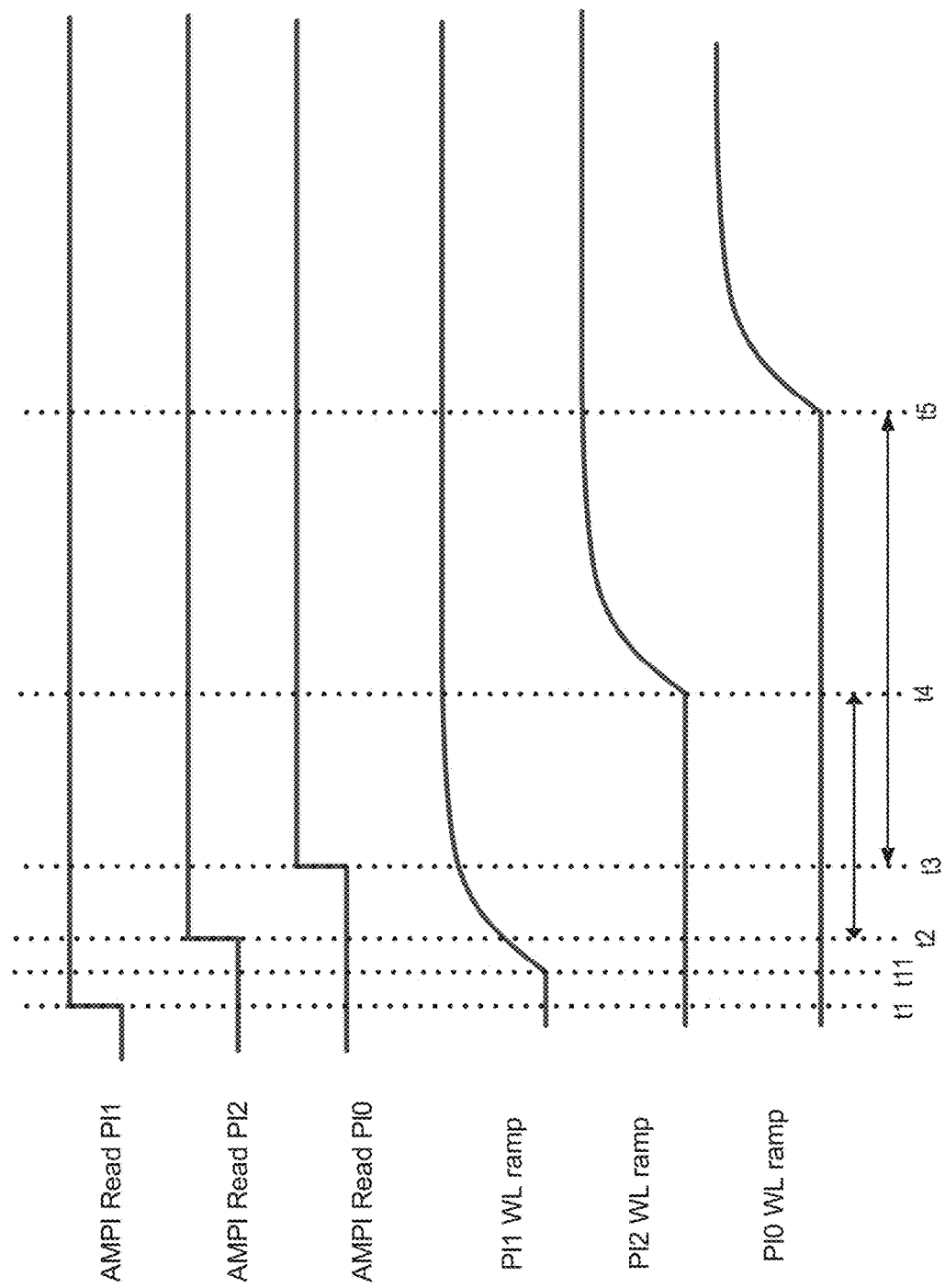

Another implementation is that the controller can ramp word lines in multiple planes at same time. Suppose multiple AMPI commands are entered while one plane is in the middle of WL ramping. After that plane completes the ramping, all the other planes that were waiting can start the word line ramping operation at same time. Since multiple planes are ramping simultaneously, the ramp time can be longer than ramping up single plane, but can be shorter than ramping the multiple planes sequentially. Specifically, as shown in FIG. 7D, a first AMPI command for a first plane (e.g., AMPI Read PI1 command as shown) is entered at time point t1, and the ramping resources including pumps and linear regulators for the first plane can start ramp at time point t11. A second AMPI command for a second plane (e.g., AMPI read PI2 as labeled) is entered at time point t2, and a third AMPI command for a third plane (e.g., AMPI read PI0 as labeled) is entered at time point t3, while the first plane is in the middle of word line ramping. After that first plane completes the ramping at time point t4, both the first plane and the second plane start the word line ramping operation simultaneously at time point t4. Thus the latency time period for the second AMPI command is (t4-t2), and the latency time period for the third AMPI command is (t4-t3).

In some embodiments for practical usage, the controller can set the data out time for each plane as a natural staggering of the AMPI command entry. As such, the probability to encounter the extra latency can be decreased to reduce the impact of the extra latency.

Further, one possible concern is the noise introduced at the steady plane biases during supply switching. As described above in connection with FIG. 6, the linear regulators are separated into two groups for regulating the first output voltage or the second output voltage to generate first priority voltage biases and second priority voltage biases respectively. The first linear regulator set 630 used for generating first priority voltage biases are plane dependent. Regulator pump supply regulators can take care of the small pump supply switching noise. The second linear regulator set 640 used for regulating the first output voltage or the second output voltage to generate the second priority voltage biases can have small drops on the outputs which do not cause array cell current change. Therefore, the impact to sensing can be ignored.

In some embodiments, the operations of the disclosed dynamic analog resource sharing scheme can be directly executed by the controller logic 212 of a NAND flash memory device as described above in connection with FIG. 2, and combined with a corresponding software module. The software module may reside in any suitable storage/memory medium, such as a random access memory, a flash memory, a read-only memory, a programmable read-only memory, an electrically erasable programmable memory, a register, etc.

Accordingly, the disclosed dynamic analog resource sharing scheme can have area and power advantages over conventional scheme to enable AMPI. There may be extra latency if the time separation of AMPI read command entries is very short. For practical usage, the data out time for each plane can stagger the AMPI command entries and the latency downside is significantly reduced.

It is noted that, in NAND memory devices, the periphery circuit beside array area architecture and the periphery circuit under array architecture may have a problem that the circuit area is larger than the array area, especially for some products with increasing number of word line tiers. Since the disclosed dynamic analog resource sharing scheme can save large circuit area, the saving can directly translate into die size and cost reductions.

One aspect of the present disclosure provides a memory device, comprising: a plurality of memory planes; a first pump set coupled with the plurality of memory planes, and configured to supply a first output voltage to a plurality of linear regulators during a steady phase; and a second pump set coupled with the plurality of memory planes, and configured to supply a second output voltage to the plurality of linear regulators during a ramping phase; wherein the plurality of linear regulators includes: a first linear regulator set configured to regulate the first output voltage or the second output voltage to generate a first voltage bias for a first group of word lines of the plurality of memory planes, and a second linear regulator set configured to regulate the first output voltage or the second output voltage to generate a second voltage bias for a second group of word lines of the plurality of memory planes.

In some embodiments, each of the plurality of memory planes comprises a plurality of memory strings coupling with a bit line correspondingly; and the first group of word lines have a higher impact to string currents of a read operation of the memory device comparing to the second group of word lines.

In some embodiments, the first group of word lines includes one or more selected word lines, and directly neighbor word lines of the one or more selected word lines.

In some embodiments, the second group of word lines include one or more dummy word lines, or one or more special word lines.

In some embodiments, the first linear regulator set includes a plurality of first linear regulator subsets each corresponding to one of the plurality of memory planes.

In some embodiments, the second linear regulator set comprises: a second linear regulator subset configured to regulate the first output voltage to generate the second voltage bias during the steady phase; and a third linear regulator subset configured to regulate the second output voltage to generate the second voltage bias during the ramping phase.

In some embodiments, the memory device further comprises a multiplexer circuit connected between the first and second pump sets and the first linear regulator set.

In some embodiments, the multiplexer circuit includes a plurality of bidirectional switches each configured to alternatively connect a corresponding first linear regulator subset to the first pump set or the second pump set.

In some embodiments, the memory device further comprises a controller configured to control one of the plurality of bidirectional switches to switch from ramping supply to holding supply after a word line ramping operation is completed.

In some embodiments, the memory device further comprises a detector configured to automatically detect a status of the word line ramping operation.

In some embodiments, the memory device is a three-dimensional NAND memory device.

In some embodiments, the controller is further configured to: control the first pump set to supply the first output voltage to the plurality of linear regulators during a steady phase in an asynchronous multi-plane independent read operation; and control the second pump set to supply the second output voltage to the plurality of linear regulators during a ramping phase in the asynchronous multi-plane independent read operation.

In some embodiments, the controller is further configured to: control the first pump set and/or the second pump set to perform a first ramping operation of a first word line in a first memory plane in response to receive a first read operation; after the first ramping operation of the first word line in the first memory plane is completed, control the first pump set and/or the second pump set to perform a second ramping operation of a second word line in a second memory plane in response to receive a second read operation.

In some embodiments, the controller is further configured to: after the first ramping operation of the first word line in the first memory plane is completed, control the first pump set and/or the second pump set to simultaneously perform a second ramping operation of a second word line in a second memory plane and a third ramping operation of a third word line in a third memory plane in response to receive a second read operation and a third read operation.

In some embodiments, the controller is further configured to: after the second ramping operation of the second word line in the second memory plane is completed, control the first pump set and/or the second pump set to perform a third ramping operation of a third word line in a second memory plane in response to receive a third read operation.

Another aspect of the present disclosure provides a method for performing asynchronous multi-plane independent read operations on a memory device comprising a plurality of memory planes, comprising: controlling a first pump set coupled to the plurality of memory planes to supply a first output voltage to a plurality of linear regulators during a steady phase; controlling a second pump set coupled to the plurality of memory planes to supply a second output voltage to the plurality of linear regulators during a ramping phase; controlling a first linear regulator set in the plurality of linear regulators to regulate the first output voltage or the second output voltage to generate a first voltage bias for a first group of word lines of one of the plurality of memory planes of the memory device; and controlling a second linear regulator set in the plurality of linear regulators to regulate the first output voltage or the second output voltage to generate a second voltage bias for a second group of word lines of one of the plurality of memory planes of the memory device.

In some embodiments, the method further comprising: controlling a second linear regulator subset to regulate the first output voltage to generate the second voltage bias during the steady phase; and controlling a third linear regulator subset to regulate the second output voltage to generate the second voltage bias during the ramping phase.

In some embodiments, the method further comprising controlling a bidirectional switch to alternatively connect a corresponding first linear regulator subset to the first pump set or to the second pump set.

In some embodiments, the method further comprising controlling the bidirectional switch to switch from ramping supply to holding supply after a word line ramping operation is completed.

In some embodiments, the method further comprising: controlling the first pump set to supply the first output voltage to the plurality of linear regulators during a steady phase in an asynchronous multi-plane independent read operation; and controlling the second pump set to supply the second output voltage to the plurality of linear regulators during a ramping phase in the asynchronous multi-plane independent read operation.

In some embodiments, the method further comprising: controlling the first pump set and/or the second pump set to perform a first ramping operation of a first word line in a first memory plane in response to receive a first read operation; after the first ramping operation of the first word line in the first memory plane is completed, controlling the first pump set and/or the second pump set to perform a second ramping operation of a second word line in a second memory plane in response to receive a second read operation.

In some embodiments, the method further comprising: after the first ramping operation of the first word line in the first memory plane is completed, controlling the first pump set and/or the second pump set to simultaneously perform a second ramping operation of a second word line in a second memory plane and a third ramping operation of a third word line in a third memory plane in response to receive a second read operation and a third read operation.

In some embodiments, the method further comprising: after the second ramping operation of the second word line in the second memory plane is completed, controlling the first pump set and/or the second pump set to perform a third ramping operation of a third word line in a second memory plane in response to receive a third read operation.

Another aspect of the present disclosure provides a memory system, comprising: a memory device disclosed above, and a memory controller configured to control the memory device to perform an asynchronous multi-plane independent read operation.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
   a plurality of memory planes;
   a first pump set coupled with the plurality of memory planes, and configured to supply a first output voltage to a plurality of linear regulators during a steady phase;
   a second pump set coupled with the plurality of memory planes, and configured to supply a second output voltage to the plurality of linear regulators during a ramping phase; and
   a plurality of bidirectional switches each configured to alternatively connect a corresponding first linear regulator subset to the first pump set or the second pump set,
   wherein the plurality of linear regulators includes:
      a first linear regulator set configured to regulate the first output voltage or the second output voltage to generate a first voltage bias, and
      a second linear regulator set configured to regulate the first output voltage or the second output voltage to generate a second voltage bias.

2. The memory device of claim 1, wherein:
   each of the plurality of memory planes comprises a plurality of memory strings coupling with a bit line correspondingly.

3. The memory device of claim 1, further comprising:
   a controller configured to control one of the plurality of bidirectional switches to switch from ramping supply to holding supply after a word line ramping operation is completed.

4. The memory device of claim 3, wherein the controller is further configured to:
   control the first pump set to supply the first output voltage to the plurality of linear regulators during the steady phase; and
   control the second pump set to supply the second output voltage to the plurality of linear regulators during the ramping phase.

5. The memory device of claim 3, wherein the controller is further configured to:
   control the first pump set and/or the second pump set to perform a first ramping operation in response to receiving a first read operation; and
   after the first ramping operation is completed, control the first pump set and/or the second pump set to perform a second ramping operation in response to receiving a second read operation.

6. The memory device of claim 5, wherein the controller is further configured to:
   after the first ramping operation of a first word line in a first memory plane is completed, control the first pump set and/or the second pump set to simultaneously perform the second ramping operation in response to receiving the second read operation and a third read operation.

7. The memory device of claim 5, wherein the controller is further configured to:
   after the second ramping operation is completed, control the first pump set and/or the second pump set to perform a third ramping operation in response to receiving a third read operation.

8. The memory device of claim 1, wherein the memory device is a three-dimensional NAND memory device.

9. A method for performing asynchronous multi-plane independent read operations on a memory device comprising a plurality of memory planes, comprising:
   controlling a first pump set coupled to the plurality of memory planes to supply a first output voltage to a plurality of linear regulators during a steady phase;
   controlling a second pump set coupled to the plurality of memory planes to supply a second output voltage to the plurality of linear regulators during a ramping phase;
   controlling a first linear regulator set in the plurality of linear regulators to regulate the first output voltage or the second output voltage to generate a first voltage bias for a first group of word lines of one of the plurality of memory planes of the memory device;
   controlling a second linear regulator set in the plurality of linear regulators to regulate the first output voltage or the second output voltage to generate a second voltage bias for a second group of word lines of one of the plurality of memory planes of the memory device;
   controlling a second linear regulator subset to regulate the first output voltage to generate the second voltage bias during the steady phase; and
   controlling a third linear regulator subset to regulate the second output voltage to generate the second voltage bias during the ramping phase.

10. The method of claim 9, wherein the plurality of memory planes comprises a plurality of memory strings coupling with a bit line correspondingly, and the first group of word lines has a higher impact on string currents of a read operation of the memory device compared to the second group of word lines.

11. The method of claim 9, wherein:
    the first group of word lines includes one or more selected word lines, and directly neighbor word lines of the one or more selected word lines; and
    the second group of word lines includes one or more dummy word lines, or one or more special word lines.

12. The method of claim 9, further comprising:
    controlling a bidirectional switch to alternatively connect a corresponding first linear regulator subset to the first pump set or to the second pump set; and
    controlling the bidirectional switch to switch from ramping supply to holding supply after a word line ramping operation is completed.

13. The method of claim 9, further comprising:
    controlling the first pump set to supply the first output voltage to the plurality of linear regulators during a steady phase in an asynchronous multi-plane independent read operation; and
    controlling the second pump set to supply the second output voltage to the plurality of linear regulators during a ramping phase in the asynchronous multi-plane independent read operation.

14. The method of claim 9, further comprising:
    controlling the first pump set and/or the second pump set to perform a first ramping operation of a first word line in a first memory plane in response to receiving a first read operation; and after the first ramping operation of the first word line in the first memory plane is completed, controlling the first pump set and/or the second pump set to perform a second ramping operation of a second word line in a second memory plane in response to receiving a second read operation.

15. The method of claim 14, further comprising:
after the first ramping operation of the first word line in the first memory plane is completed, controlling the first pump set and/or the second pump set to simultaneously perform the second ramping operation of the second word line in the second memory plane and a third ramping operation of a third word line in a third memory plane in response to receiving the second read operation and a third read operation.

16. The method of claim 14, further comprising:
after the second ramping operation of the second word line in the second memory plane is completed, controlling the first pump set and/or the second pump set to perform a third ramping operation of a third word line in the second memory plane in response to receiving a third read operation.

17. A method for performing asynchronous multi-plane independent read operations on a memory device comprising a plurality of memory planes, comprising:
controlling a first pump set coupled to the plurality of memory planes to supply a first output voltage to a plurality of linear regulators during a steady phase;
controlling a second pump set coupled to the plurality of memory planes to supply a second output voltage to the plurality of linear regulators during a ramping phase;
controlling a first linear regulator set in the plurality of linear regulators to regulate the first output voltage or the second output voltage to generate a first voltage bias for a first group of word lines of one of the plurality of memory planes of the memory device;
controlling the first pump set and/or the second pump set to perform a first ramping operation of a first word line in a first memory plane in response to receiving a first read operation; and
after the first ramping operation of the first word line in the first memory plane is completed, controlling the first pump set and/or the second pump set to perform a second ramping operation of a second word line in a second memory plane in response to receiving a second read operation.

18. The method of claim 17, further comprising:
after the first ramping operation of the first word line in the first memory plane is completed, controlling the first pump set and/or the second pump set to simultaneously perform the second ramping operation of the second word line in the second memory plane and a third ramping operation of a third word line in a third memory plane in response to receiving a second read operation and a third read operation.

19. The method of claim 17, further comprising:
after the second ramping operation of the second word line in the second memory plane is completed, controlling the first pump set and/or the second pump set to perform a third ramping operation of a third word line in the second memory plane in response to receiving a third read operation.

20. The method of claim 17, wherein the plurality of memory planes comprises a plurality of memory strings coupling with a bit line correspondingly, and the first group of word lines has a higher impact on string currents of a read operation of the memory device compared to the second group of word lines.

* * * * *